United States Patent

Venkatraman

Patent Number: 5,677,244
Date of Patent: Oct. 14, 1997

[54] METHOD OF ALLOYING AN INTERCONNECT STRUCTURE WITH COPPER

[75] Inventor: Ramnath Venkatraman, Austin, Tex.

[73] Assignee: Motorola, Inc., Schaumburg, Ill.

[21] Appl. No.: 650,559

[22] Filed: May 20, 1996

[51] Int. Cl.[6] .................................................. H01L 21/441
[52] U.S. Cl. ........................ 437/198; 437/192; 437/194
[58] Field of Search .............................. 437/198, 192, 437/194, 197

[56] References Cited

U.S. PATENT DOCUMENTS

| | | |
|---|---|---|
| 4,489,482 | 12/1984 | Keyser et al. . |
| 5,112,773 | 5/1992 | Tuttle ........................... 437/109 |
| 5,273,775 | 12/1993 | Dyer et al. . |
| 5,354,712 | 10/1994 | Ho et al. ....................... 437/195 |
| 5,391,517 | 2/1995 | Gelatos et al. ................ 437/190 |
| 5,527,739 | 6/1996 | Parillo et al. ................. 437/198 |

OTHER PUBLICATIONS

S.M. Fine, et al. "Consecutive Selective Chem. Vap. Dep. of Copper and Aluminum From Organometallic Precursors" Chem. Perspectives of Microelectronic Materials III Symp. (Mater. Res. Soc. 1993) pp. 329–334.

*Primary Examiner*—John Niebling
*Assistant Examiner*—C. Everhart

[57] ABSTRACT

An interconnect structure (10) is formed by filling a dual damascene structure (12) with conductive material. A barrier layer (13) is formed to serve as a seed layer and to prevent the out-diffusion of copper. A discontinuous film (30) of islands (41) is used to dope the interconnect structure (10) with copper. A conductive layer (14) is formed to fill a first portion (21) and a second portion (22) of the damascene structure (12). An anneal step is performed to diffuse the copper into the conductive layer (14).

20 Claims, 1 Drawing Sheet

//5,677,244//

METHOD OF ALLOYING AN INTERCONNECT STRUCTURE WITH COPPER

RELATED APPLICATION

Related subject matter is disclosed in a co-pending, commonly assigned patent application having Related subject matter is also disclosed in co-pending, commonly assigned patent application having, Ser. No. 08/650,560 and, Ser. No. 08/650,506 and filed on even date.

BACKGROUND OF THE INVENTION

This invention relates, in general, to interconnect structures, and more particularly to doping an interconnect structure with a source of copper.

A dual damascene structure has a bottom portion that contacts an underlying conductor and replaces the functionality of a plug structure in a traditional interconnect structure. The dual damascene structure also has a top portion that is an inlaid trench structure that is used for the formation of a second conductor. The advantage of dual damascene structures is that because the bottom and top portions of a dual damascene structure are in contact with each other, they can be filled simultaneously with the same conductive material. This obviates the need to form a plug structure and an overlying conductive layer in separate processing steps.

To improve the electromigration properties of a dual damascene structure, it is desirable to dope or alloy the structure with copper. One method for filling a dual damascene structure first fills the bulk of the structure with an aluminum film. An aluminum-copper alloy film is then formed on the underlying aluminum film. An anneal step is then used to drive the copper from the aluminum-copper alloy film into the damascene structure. One drawback with this technique is that since the copper source is above the dual damascene structure, it is difficult or more time consuming to diffuse the copper evenly throughout the damascene structure. Quite often a diffusion gradient is formed so that there is a higher copper concentration in the top trench portion of the damascene structure and a significantly lower copper concentration is the bottom, via-like portion of the structure. As a result, the bottom portion of the damascene structure will be more susceptible to electromigration than the rest of the structure.

By now it should be appreciated that it would be advantageous to provide a technique for filling an interconnect structure with a conductive material that has an improved distribution of copper throughout the interconnect structure.

DETAILED DESCRIPTION OF THE DRAWINGS

The present invention provides a method of filling a dual damascene structure, or other interconnect structure such as a via opening, and doping the interconnect structure with copper. The method includes the formation of a discontinuous film comprising copper that is used to improve the electromigration resistance of the interconnect structure. The discontinuous film is made up of islands of conductive material. Since this film is discontinuous, portions of an underlying barrier layer are also exposed to improve the adhesion of the material used to fill the interconnect structure. One benefit of the present invention is that all of the process steps used to form the interconnect structure can be performed below about 400° C. Because of this relatively low temperature processing, the present invention can be used in conjunction with other materials, such as low dielectric constant materials, and processes used in the semiconductor industry. The technique described below also has the unexpected benefit of reducing the roughness and reflectivity of the material used to fill the interconnect structure.

Figure 1:
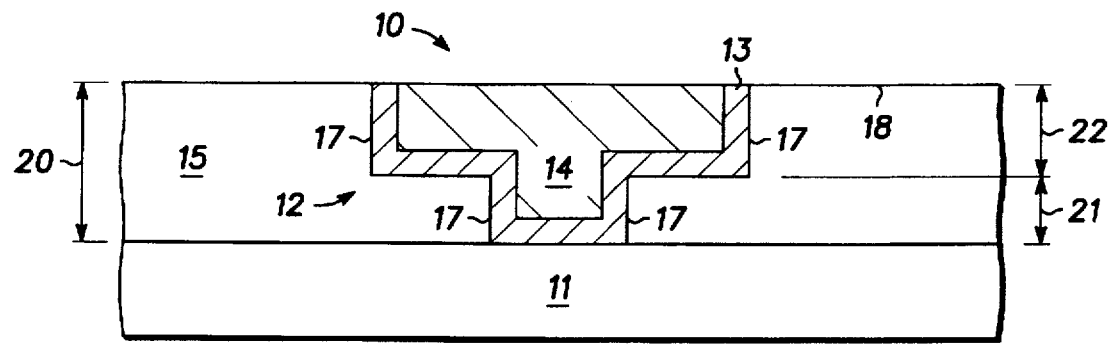
FIG. 1 is an enlarged cross-sectional view of an interconnect structure in accordance with the present invention.

Turning now to FIG. 1, a detailed description of the present invention is provided. FIG. 1 is an enlarged cross-sectional view of an interconnect structure 10 that is formed in a dual damascene structure 12. Damascene structure 12 is formed in a dielectric layer 15 and comprises two regions, namely a first portion 21 and a second portion 22. First portion 21 is in contact with a first conductor 11 and second portion 22 represents a second conductor. For example, first conductor 11 could be a metal one line and second portion 22 can perform the function of an overlying metal two line. First portion 21, therefore, provides an electrical connection between first conductor 11 and second portion 22 of damascene structure 12.

Interconnect structure 10 comprises a barrier layer 13, which acts as a seed layer and retards the out diffusion of copper into dielectric layer 15. First portion 21 and second portion 22 of damascene structure 12 are filled with a conductive layer 14, which provides the conductive material used to form the metal line of second portion 22, and electrically couple second portion 22 to first conductor 11 with first portion 21. A discontinuous film (not shown) of copper is formed on barrier layer 13 prior to the formation of conductive layer 14. Following the formation of conductive layer 14, an anneal step is performed to diffuse the copper throughout conductive layer 14. Since the discontinuous film of copper is formed on all surfaces of barrier layer 13, the distribution of copper is relative even throughout interconnect structure 10.

Figure 2:
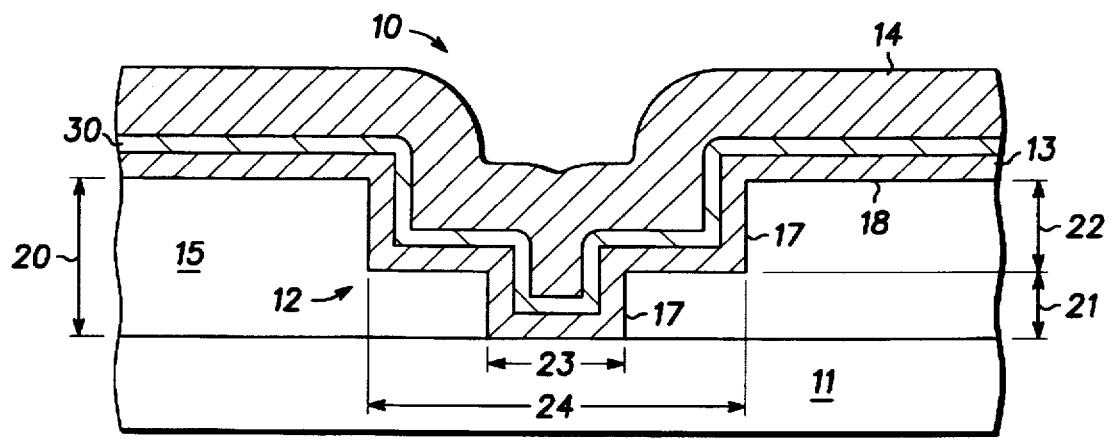
FIG. 2 is an enlarged cross-sectional view of the interconnect structure of FIG. 1 at an intermediate point in fabrication.

Referring now to FIG. 2, a method for forming interconnect structure 10 is provided. Dielectric layer 15 is formed on first conductor 11 using well known deposition techniques such as the chemical vapor deposition of silicon dioxide using tetraethylorthosilane (TEOS). Two sequential photolithographic and reactive ion etch techniques are then used to remove portions of dielectric layer 15 to form damascene structure 12 as shown in FIG. 2. The etch process will form first portion 21 and second portion 22 of damascene structure 12 such that they have a width 23 and a width 24, respectively. Damascene structure 12 will have an aspect ratio that is defined as the height of first portion 21 and second portion 22 (shown as height 20) divided by the width 23 of first portion 21. Preferably, the aspect ratio of damascene structure 12 is greater than about 2.5.

The dimensions of damascene structure 12 can vary depending on the electrical requirements of interconnect structure 10. For example, second portion 22 can be very wide such as 20 microns to provide a large current carrying capability or can be relatively small such as 0.1 microns to conserve space within a semiconductor device. Width 23 of first portion 21 is generally limited to the photolithographic processing capability and the ability of the following process steps to completely fill in first portion 21. For example, first portion 21 can be about 0.1 microns to 3 microns wide.

After the formation of damascene structure 12, barrier layer 13 is formed along the sides 17 of damascene structure 12 and the top surface 18 of dielectric layer 15. Barrier layer 13 can be formed using a variety of techniques such as sputtering, evaporation, chemical vapor deposition (CVD), or plasma enhanced chemical vapor deposition (PECVD). Barrier layer 13 is about 25 angstroms to 4000 angstroms thick and can comprise a variety of materials such as titanium, titanium nitride, and aluminum. Preferably, the process used to form barrier layer 13 does not exceed 400° C. during deposition.

Figure 3:
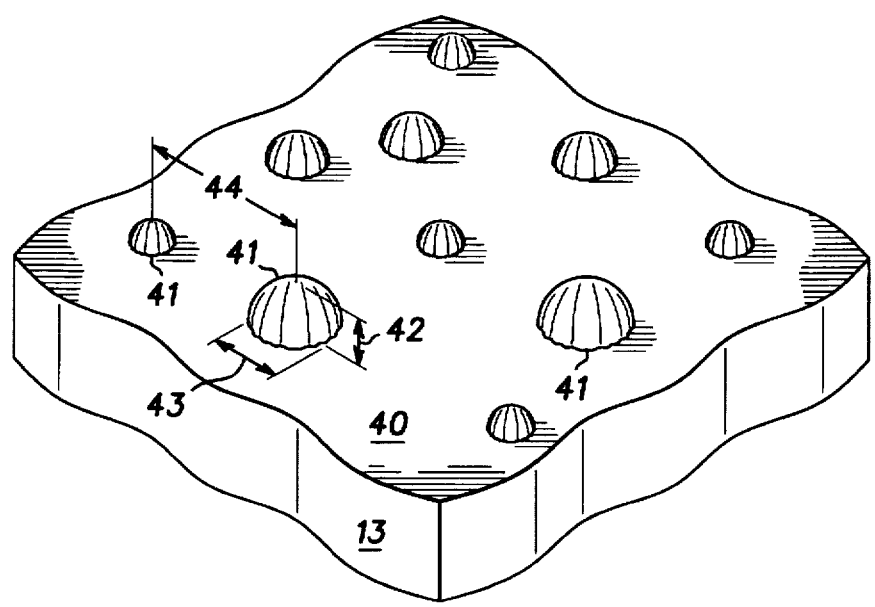
FIG. 3 is an isometric view of a portion of the interconnect structure during fabrication.

A discontinuous film 30 comprising copper is then formed overlying barrier layer 13. An enlarged isometric view of discontinuous film 30 is shown in FIG. 3. Discontinuous film 30 is characterized by islands 41 of conductive material that are distributed across the surface 40 of barrier layer 13. Islands 41 are physically isolated from each other by an average distance shown in FIG. 3 as a distance 44. Islands 41 also have an average height or thickness shown as a height 42 and an average width 43. The center of each island 41 represents a nucleation site where the deposition of discontinuous film 30 began. If the deposition of discontinuous film 30 were allowed to continue, the width and height of each island would increase until a solid film is formed that would completely cover barrier layer 13. With the present invention, it is desirable to stop the formation of discontinuous film 30 such that portions of barrier layer 13 are still exposed.

Discontinuous film 30 is preferably formed from a chemical vapor deposition (CVD) using the decomposition of Copper (I) hexafluoroacetyl acetonate-trimethylvinyl silane (Cu(I)hfac(VTMS)) at about 150° C. to 275° C. This material has the chemical formula of $C_{10}H_{12}CuF_6O_2Si$. Such a reaction can be performed in a "Precision 5000" reactor. "Precision 5000" is a registered trademark of Applied Materials Inc. of Santa Clara, Calif. A carrier gas such as helium is used to transport the decomposed copper to the surface 40 of barrier layer 13. The conductance of the gas delivery system is adjusted such that the deposition rate of discontinuous film 30 is relatively low. Preferably the deposition rate is about 0.1 angstroms to 1 angstrom per second. This low deposition rate allows for the controlled and repeatable formation of islands 41 rather than a continuous, solid film of copper. In addition, because the deposition rate is very low, it is possible to reproduce the formation of discontinuous film 30 across different manufacturing lots with accurate control of its thickness.

As deposited, discontinuous film 30 is about 5 angstroms to 75 angstroms thick, and preferably, discontinuous film 30 is about 10 angstroms to 25 angstroms thick. This means that the average height 42 of islands 41 is about 5 angstroms to 75 angstroms. Islands 41 grow relatively evenly in all directions such that the average width 43 of each island is approximately equal to its height 42, or about 5 angstroms to 75 angstroms as well. The distribution or density of islands 41 across barrier layer 13 is defined as the percentage of barrier layer 13 that is covered by islands 41. For example, a density of 60 percent means that 60 percent of barrier layer 13 is covered by islands 41, and thus 40 percent of barrier layer 13 is exposed. Preferably, discontinuous film 30 has a density of about 10 percent to 90 percent, and more preferably, about 30 percent to 70 percent. The number of islands 41 formed on barrier layer 13 and the average distance 44 between neighboring islands 41 is dependent on the composition of the material used to form barrier layer 13. Average distance 44 is about 10 angstroms to 2,000 angstroms.

The exposed portions of barrier layer 13 subsequently act as a seed layer for the formation of conductive layer 14. Conductive layer 14 is formed with a chemical vapor deposition process using the decomposition of dimethylaluminumhydride (DMAH). Using a CVD process, first conductive layer 14 conforms to the sides 17 of damascene structure 12 and fills first portion 21 and second portion 22. It should be understood that conductive layer 14 can comprise materials other than aluminum such as copper or copper-aluminum alloys, and that conductive layer 14 is preferably formed at a temperature below about 400° C. The formation of conductive layer 14 using the CVD process described above can be performed at 180° C. to 350° C. using the same "Precision 5000" reactor. By using the same reactor to form both discontinuous film 30 and conductive layer 14 the oxidation of discontinuous film 30 is prevented between depositions.

Following the formation of conductive layer 14, an anneal step may be performed to drive the copper in discontinuous film 30 into interconnect structure 10. Preferably, the anneal step is performed in an inert ambient such as hydrogen and nitrogen and is performed at a temperature below about 400° C. such as 150° C. to 390° C. An anneal of about 1 to 2 hours should be adequate. It should be understood that the thickness of discontinuous film 30, the anneal temperature, and the anneal time can be varied to control the distribution of copper throughout interconnect structure 10. The anneal step may also be omitted if the temperatures of subsequent processing to a semiconductor device the employs interconnect structure 10 are sufficient to drive the copper into conductive layer 14. Preferably, the interconnect structure has a copper concentration of about 1 percent to 12 percent copper by weight following the anneal process.

Since discontinuous film 30 is formed over all surfaces of barrier layer 13, the distribution of copper will be more uniform than a previously known method that dopes conductive layer 14 with an overlying copper layer and subsequent anneal. In particular, the concentration of copper in first portion 21 of interconnect structure 10 will be comparable to the concentration in second portion 22. As a result, the reliability of interconnect structure 10 in first portion 21 is improved over the above mentioned previously known technique.

Referring back now to FIG. 1, a polishing process is used to remove the excess portions of barrier layer 13 and conductive layer 14 on the top surface 18 of dielectric layer 15. A mechanical or a chemical and mechanical polish (CMP) process is used to physically remove the excess material and define interconnect structure 10. After the polishing process, interconnect structure 10 has a metal line formed in a trench, second portion 22, that is electrically coupled to first conductor 11 by a via-like structure of first portion 21. It should also be noted that following the anneal step, discontinuous film 30 is no longer confined to the surface of barrier layer 13 which is why it is not shown in FIG. 1.

It should also be understood that interconnect structure 10 need not be limited to dual damascene structures. Instead of filling a dual damascene structure 12 (see FIG. 1), the method of the present invention can also be used to fill a single via opening (not shown). In this embodiment, barrier layer 13 discontinuous film 30, and conductive layer 14 are used to form a via-like region. Barrier layer 13 and conductive layer 14 can then be patterned using conventional photolithographic and etch techniques to form an overlying conductor such as a metal line (not shown).

One of the many advantages of interconnect structure 10 of the present invention is that the processes used to form barrier layer 13 and conductive layer 14 are very conformal. Therefore, the present invention can be used to fill damascene structures that have high aspect ratios such as aspect ratios greater than five. In addition, all of the above mentioned processes can be performed below 400° C. This allows interconnect structure 10 to be used as part of a multi-level metallization scheme in complex semiconductor devices with reduced risk of damaging other portions of the semiconductor devices. Finally, the present invention provides a method of alloying an aluminum via region to improve the overall electromigration resistance of the interconnect structure 10.

The present invention also provides an unexpected improvement in the reflectivity and roughness of conductive layer 14 following the anneal step used to diffuse discontinuous film 30 into conductive layer 14. Experiments were performed where conductive layers of CVD aluminum were deposited with and without the use of an underlying discontinuous film of CVD copper. The use of the discontinuous film of copper islands reduced the roughness of the aluminum layer by over 30 percent and reduced the reflectivity of the aluminum layer by over 35 percent when compared to aluminum films that were formed without the underlying discontinuous layer of copper By now it should be appreciated that the present invention provides a method for forming an interconnect structure with improved copper distribution compared to some previously known techniques. The method can be performed below 400° C. to reduce the exposure of neighboring structures to high temperature processing. The present invention also provides a method for reducing the reflectivity and roughness of an aluminum layer using a discontinuous film copper.

I claim:

1. A method for alloying an interconnect structure with copper comprising the steps of:

providing a damascene structure that has sides;

forming a barrier layer on the sides of the damascene structure;

forming a discontinuous film comprising copper on the barrier layer, wherein the discontinuous film has islands of conductive material that are separated from each other by an average distance so that portions of the barrier layer are exposed, the discontinuous film exposing portions of the barrier layer to form exposed portions of the barrier layer; and depositing a film comprising aluminum wherein the film comprising aluminum is deposited in contact with both the discontinuous film comprising copper and the exposed portions of the barrier layer.

2. The method of claim 1 wherein the damascene structure has an aspect ratio greater than about 2.5.

3. The method of claim 1 wherein the barrier layer comprises a material selected from the group consisting of titanium, titanium nitride, copper, and aluminum.

4. The method of claim 1 wherein the step of forming the film comprising aluminum comprises forming the film comprising aluminum at a temperature below 400° C. using a dimethylaluminumhydride (DMAH) deposition source.

5. The method of claim 4 further comprising the step of annealing the discontinuous film so that copper is diffused into the film comprising aluminum.

6. The method of claim 5 wherein the step of annealing the discontinuous film is performed at a temperature below 400° C.

7. The method of claim 1 wherein the discontinuous film is formed from a chemical vapor deposition process at a temperature below 400° C.

8. The method of claim 1 wherein the average distance between islands of conductive material is 10 angstroms to 2,000 angstroms.

9. The method of claim 1 wherein the islands of conductive material have an average height between 5 angstroms and 75 angstroms.

10. The method of claim 1 wherein the islands of conductive material have an average height of 10 angstroms to 25 angstroms.

11. A method of filling an interconnect structure, wherein the interconnect structure has sides, the method comprising the steps of:

forming a barrier layer on the sides of the interconnect structure, wherein the barrier layer is formed at a temperature below about 400° C.;

forming a discontinuous film comprising copper overlying the barrier layer, wherein the discontinuous film has islands of conductive material that are separated from each other by an average distance, and the discontinuous film is formed at a temperature below about 400° C.;

forming a conductive layer overlying the discontinuous film, wherein the conductive layer comprises aluminum and is formed at a temperature below about 400° C.; and annealing the interconnect structure so that copper is diffused into the conductive layer.

12. The method of claim 11 wherein the step of annealing the interconnect structure is performed at a temperature below about 400° C.

13. The method of claim 11 wherein the interconnect structure has an aspect ratio greater than about 2.5.

14. The method of claim 11 wherein the barrier layer comprises a material selected from the group consisting of titanium, titanium nitride, copper, and aluminum.

15. The method of claim 11 wherein the interconnect structure has a copper concentration of about 1 percent to 12 percent copper by weight.

16. The method of claim 11 wherein the average distance between islands of conductive material is about 10 angstroms to 2,000 angstroms.

17. A method of filling an interconnect structure that has an aspect ratio greater than about 3.5, wherein the interconnect structure has sides, the method comprising the steps of:

forming a barrier layer on the sides of the interconnect structure, wherein the barrier layer is formed at a temperature below about 400° C.;

forming a discontinuous film comprising copper overlying the barrier layer, wherein the discontinuous film has islands of conductive material that are separated from each other by an average distance of about 10 angstroms to 2,000 angstroms, and the discontinuous film is formed at a temperature below about 400° C.;

forming an aluminum containing layer overlying the barrier layer, wherein the aluminum containing layer is formed at a temperature below about 400° C.; and annealing the discontinuous film at a temperature below about 400° C. so that copper is diffused into the aluminum containing layer.

18. The method of claim 17 wherein the barrier layer comprises a material selected from the group consisting of titanium, titanium nitride, copper, and aluminum.

19. The method of claim 17 wherein the interconnect structure has a copper concentration of about 1 percent to 12 percent copper by weight.

20. The method of claim 17 wherein the islands of conductive material have an average height of about 10 angstroms to 25 angstroms.

* * * * *